(12) United States Patent
Huang et al.

(10) Patent No.: US 10,177,124 B1
(45) Date of Patent: Jan. 8, 2019

(54) FLEXIBLE MICRO-LED DISPLAY MODULE

(71) Applicant: FLEX TEK CO., LTD., Taoyuan (TW)

(72) Inventors: Yao-Hsien Huang, Taoyuan (TW); Sheng-Hui Chen, Hsinchu (TW)

(73) Assignee: FLEX TEK CO., LTD. (TW)

( * ) Notice: Subject to any disclaimer, the term of this patent is extended or adjusted under 35 U.S.C. 154(b) by 0 days.

(21) Appl. No.: 15/910,148

(22) Filed: Mar. 2, 2018

(30) Foreign Application Priority Data

Jan. 26, 2018 (TW) .............................. 107102860 A

(51) Int. Cl.
| | |
|---|---|
| *H01L 25/075* | (2006.01) |
| *H01L 23/538* | (2006.01) |
| *H01L 33/06* | (2010.01) |
| *H01L 33/12* | (2010.01) |
| *H01L 33/32* | (2010.01) |
| *H01L 33/40* | (2010.01) |
| *H01L 33/58* | (2010.01) |
| *H01L 33/62* | (2010.01) |
| *H01L 33/50* | (2010.01) |
| *G09G 3/32* | (2016.01) |

(52) U.S. Cl.
CPC ...... *H01L 25/0753* (2013.01); *H01L 23/5387* (2013.01); *H01L 33/06* (2013.01); *H01L 33/12* (2013.01); *H01L 33/32* (2013.01); *H01L 33/40* (2013.01); *H01L 33/502* (2013.01); *H01L 33/58* (2013.01); *H01L 33/62* (2013.01); *G09G 3/32* (2013.01); *G09G 2330/10* (2013.01); *G09G 2380/02* (2013.01); *H01L 2933/0083* (2013.01)

(58) Field of Classification Search
CPC ....... H01L 33/502; H01L 33/06; H01L 33/62; H01L 33/58; H01L 33/12; H01L 33/40; H01L 33/32; H01L 25/0753; H01L 2933/0083; G09G 2380/02; G09G 3/32; G09G 2330/10
See application file for complete search history.

(56) References Cited

U.S. PATENT DOCUMENTS

| | | | |
|---|---|---|---|
| 8,941,566 B2 * | 1/2015 | Haase | H01L 27/156 345/82 |
| 2014/0367633 A1 * | 12/2014 | Bibl | G02F 1/133603 257/13 |
| 2017/0343859 A1 * | 11/2017 | Chen | G02B 5/201 |
| 2018/0219183 A1 * | 8/2018 | Song | H01L 51/5275 |

* cited by examiner

*Primary Examiner* — Yosef Gebreyesus

(57) ABSTRACT

The present invention discloses a flexible micro-LED display module, comprising: a flexible substrate, a substrate protection layer, a lattice matching layer, an LED array, a transparent conductive substrate, and a light conversion layer. The light conversion layer is constituted by a plurality of red light conversion units, a plurality of green light conversion units, and a plurality of blue light conversion units, such that one pixel is formed by one red light conversion unit, one green light conversion unit, one blue light conversion unit, and several light-emitting elements. In the case of some light-emitting elements failing to radiate light normally, the defective pixel correction circuit is used to apply luminous intensity adjusting process to other light-emitting elements working normally, so as to make the flexible micro-LED display module able to display video or images with the lowest number of defective pixels capable of meeting the requirements of pixel standards.

14 Claims, 10 Drawing Sheets

FLEXIBLE MICRO-LED DISPLAY MODULE

BACKGROUND OF THE INVENTION

1. Field of the Invention

The present invention relates to the technology field of display devices, and more particularly to a flexible micro-LED display module.

2. Description of the Prior Art

With the high development of display technologies, traditional cathode ray tube (CRT) displays have been replaced by thin film transistor liquid crystal displays (TFT-LCD) completely. FIG. 1 shows a cross-sectional side view of a TFT-LCD module. From FIG. 1, it is understood that the TFT-LCD module 1a comprises: a backlight unit 11a, a lower polarization sheet 12a, a lower glass substrate 13a, a plurality of optical valves 14a, a liquid crystal layer 15a, a transparent conductive layer 16a, a color filter sheet 17a, an upper glass substrate 18a, and a lower polarization sheet 19a. In which, the said optical valve 14a is a thin film transistor (TFT), and the color filter sheet 17a comprises at least one red light conversion portion, at least one green light conversion portion and at least one blue light conversion portion.

It is worth mentioning that, pixel density (resolution) of the TFT-LCD module 1a has now largely enhanced due to the advanced TFT manufacturing technologies. It is well known that the liquid crystal layer 15a is not a self-luminous material. Accordingly, to make the TFT-LCD module 1a display an image, it needs to control the orientational order of the molecules of the liquid crystal layer 15a by driving the optical valves 14a, such that a white light beam provided by the backlight unit 11a is able to pass through the liquid crystal layer 15a. As a result, the white light beam is converted to a plurality of red light beams, a plurality green light beams and a plurality blue light beams by the color filter sheet 17a, and then the red light beams, the green light beams and the blue light beams are further mixed for presenting a plurality of color dots (i.e., pixels). Engineers skilled in design and development of TFT-LCDs should know that, the optical efficiency, the luminous intensity, and the dynamic contrast performance of the TFT-LCD module 1a are relied on the light transmittance of the liquid crystal layer 15a. On the other hand, owing to the fact that the white light provided by the backlight unit 11a is generated from a plurality of white LED components, the depth of colour saturation perform by the TFT-LCD module 1a can merely reach 72% NTSC.

Recently, LED display module is widely applied in plane displays because of having advantages of power saving, wide color gamut (~140% NTSC), high luminous intensity, and high dynamic contrast. FIG. 2 shows a stereo exploded diagram of an LED display module. The LED display module 1' comprises: a glass substrate 11', an adhesive layer 12', an LED array comprising a plurality of red LED components 14R', a plurality of green LED components 14G' and a plurality of blue LED components 14B', a first substrate 15' provided with a plurality of row conductors 16R', and a second substrate 15b' provided with a plurality of column conductors 16C'. During the operation of the LED display module 1', a (colour) pixel is exhibited by achieving the lighting of one red LED component 14R', one green LED component 14G' and one blue LED component 14B'. Therefore, it is able to calculate that each of pixels in a Full HD (1920×1080) 5.5-inch LED display module 1' has an area size of 63 μm×63 μm.

As the engineers skilled in development and manufacture of LED chips know, GaN and InGaN are the common materials adopted for making an active layer of an LED chip. It has been found that, the GaN material not only includes high-density defects but also exhibits poor lattice match with sapphire substrate. For commercial LED chips, the poor lattice match is solved by inserting an AlN buffer layer between the sapphire substrate and the GaN layer. It is a pity, however, that the AlN buffer layer also includes high-density defects.

Continuously referring to FIG. 2, and please simultaneously refer to FIG. 3 showing a block diagram of the LED display module and a control circuit thereof. The control circuit 2' is used to control the lighting of the LED components (14R', 14G', 14B) in the LED display module 1', and comprises: a column drive unit 2C', a row drive unit 2R', a controlling and processing unit 20', and a defective pixel correction unit 2PC'. Since there is a non-uniform lighting phenomenon resulted from errors of manufacturing process occurring between the LED components (14R', 14G', 14B'), the defective pixel correction unit 2PC' is now arranged in the control circuit 2' for correcting luminance and chrominance defects of the LED display module 1' having LED matrix. It is worth explaining that, if there are some specific pixels cannot be corrected or repaired by the defective pixel correction unit 2PC', these specific pixels are regarded as defective (dead) pixels of the LED display module 1'. Please refer to following Table (1), different standards for requiring the maximum defective pixels of various laptop computers are defined by IBM.

TABLE (1)

| Resolution | Bright dot defects | Dark dot defects | Total number of defective (dead) pixels |
|---|---|---|---|
| Q × GA (2048 × 1536) | 15 | 16 | 16 |
| U × GA (1600 × 1200) | 11 | 16 | 16 |
| S × GA + (1400 × 1050) | 11 | 13 | 16 |
| XGA (1024 × 768) | 8 | 8 | 9 |
| SVGA (800 × 600) | 5 | 5 | 9 |

From above descriptions, it is clear that how to effectively control the total number of defective (dead) pixels of the LED display module 1' has become an important issue. In view of that, inventors of the present application have made great efforts to make inventive research and eventually provided a flexible micro-led display module.

SUMMARY OF THE INVENTION

The primary objective of the present invention is to disclose a flexible micro-LED display module, comprising: a flexible substrate, a substrate protection layer, a lattice matching layer, a light-emitting structure, a transparent conductive substrate, and a light conversion layer. In the present invention, particularly, the light conversion layer is designed to constituted by a plurality of red light conversion units, a plurality of green light conversion units, and a plurality of blue light conversion units, such that a single pixel is formed by one red light conversion unit, one green light conversion unit, one blue light conversion unit, and several light-emitting elements. By such arrangement, in the case of the fact that there are one or two light-emitting elements failing to radiate light normally, the defective pixel correction circuit is immediately used to apply a luminous intensity adjusting process to other light-emitting elements working normally, so as to make the flexible micro-LED display module able to display video or images with the lowest number of defective pixels capable of meeting the requirements of pixel standards.

In order to achieve the primary objective of the present invention, the inventor of the present invention provides an embodiment for the flexible micro-LED display module, comprising:
a flexible substrate, made of a thin metal material;
a substrate protection layer, formed on or covering the flexible substrate;
a lattice matching layer, formed on the substrate protection layer;
a light emitting array comprising a plurality of light emitting elements, formed on the lattice matching layer, and each of the plurality of light emitting elements comprising:
  a first semiconductor layer, being formed on the lattice matching layer;
  an active layer, being formed on the first semiconductor layer;
  a second semiconductor layer, being formed on the active layer;
  a first electrode, being electrically connected to the first semiconductor layer; and
  a second electrode, being electrically connected to the second semiconductor layer; and
a light conversion layer, disposed on the transparent conductive substrate and comprising a plurality of red light conversion units, a plurality of green light conversion units and a plurality of blue light conversion units;
wherein each of the plurality of red light conversion units, each of the plurality of green light conversion units and each of the plurality of blue light conversion units all simultaneously shield multi light emitting elements under the isolation provided by the transparent conductive substrate.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a flexible micro-LED display module disclosed by the present invention, embodiments of the present invention will be described in detail with reference to the attached drawings hereinafter.

Figure 4:
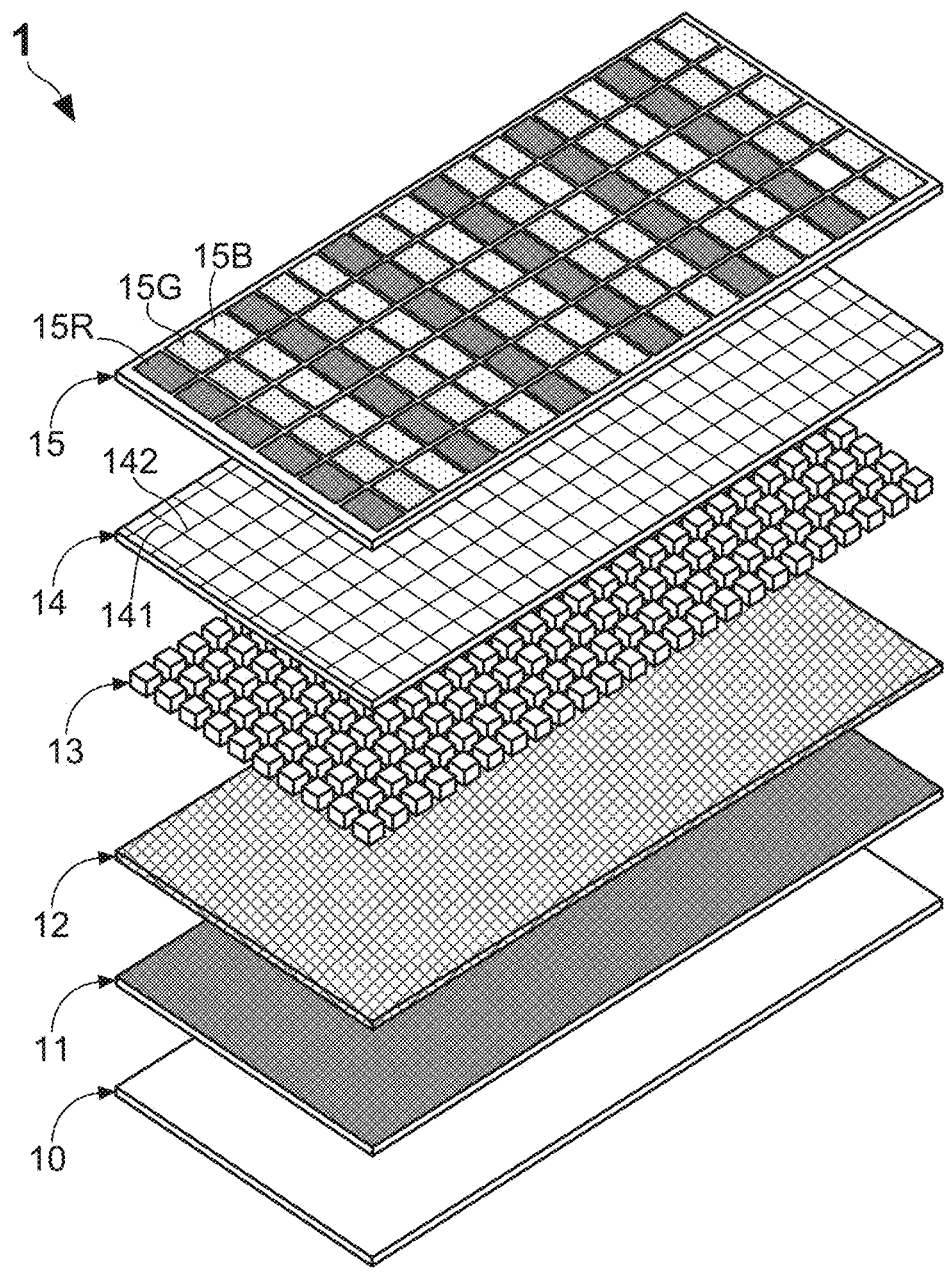
FIG. 4 shows a stereo exploded diagram of a first embodiment of a flexible micro-LED display module according to the present invention.

With reference to FIG. 4, there is provided a stereo exploded diagram of a first embodiment of a flexible micro-LED display module according to the present invention. As FIG. 4 shows, the flexible micro-LED display module 1 of the present invention is designed for use in various LED displays, and comprises: a flexible substrate 10, a substrate protection layer 11, a lattice matching layer 12, an LED array comprising a plurality of light emitting elements 13, a transparent conductive substrate 14, and a light conversion layer 15. According to the present invention, the flexible substrate 10 is made of a thin metal material and has a thickness in a range from 20 μm to 500 μm, wherein the thin metal material is selected from the group consisting of stainless steel, copper (Cu), gold (Au), nickel (Ni), molybdenum (Mo), titanium (Ti), tungsten (W), and combination of aforesaid two or more materials. In addition, the flexible substrate 10 is provided with a substrate protection layer 11 thereon. It is worth noting, however, that the flexible substrate 10 can also be enclosed by the substrate protection layer 11 in other embodiments even though FIG. 4 describing that the substrate protection layer 11 is formed on the flexible substrate 10. Moreover, according to the present invention, the substrate protection layer 11 has a thickness in a range between 50 nm and 1000 nm, and is made of a specific material selected from the group consisting of $SiO_2$, $TiO_2$, NiO, $Al_2O_3$, ZnO, nitride, halide, Si-based compound, and combination of aforesaid two or more materials. Thus, by the use of the substrate protection layer 11, the flexible substrate 10 would be protected from being polluted by epitaxial materials during the formation of the multi-layered semiconductor epitaxial film.

It is worth noting that, the lattice matching layer 12 is formed on the substrate protection layer 11 and made of a crystalline material having a specific crystal orientation, such as AlN, undoped-GaN, and ZnO. Herein $SiO_2$ and AlN are taken as exemplary materials for making the substrate protection layer 11 and the lattice matching 12, respectively. The AlN has a hexagonal wurtzite structure with lattice constants (a=0.311 nm, c=0.498 nm). On the other hand, β-cristobalite $SiO_2$ has a lattice constant a=0.499 nm. What it must emphasize the fact that the substrate protection layer 11 made of $SiO_2$ can not only protect the flexible substrate 10 from being polluting by epitaxial vapor-phase substances, but also facilitate the AlN film (i.e., the lattice matching layer 12) be formed on the substrate protection layer 11 along c-axis orientation. Moreover, other possible materials can be processed to be the substrate protection layer 11 and the lattice matching layer 12 are listed in following Table (2) and Table (3).

TABLE (2)

| Materials | Lattice constant (nm) |
| --- | --- |
| TiO2 | a=0.462 |
| NiO | a=0.418 |
| SnO2 | a=0.474 |
| Al2O3 | a=0.478 |

TABLE (3)

| Materials | Lattice constant (nm) | |
| --- | --- | --- |
| GaN | a=0.3186 | c=0.5185 |
| ZnO | a=0.328 | c=0.52 |

Figure 5:
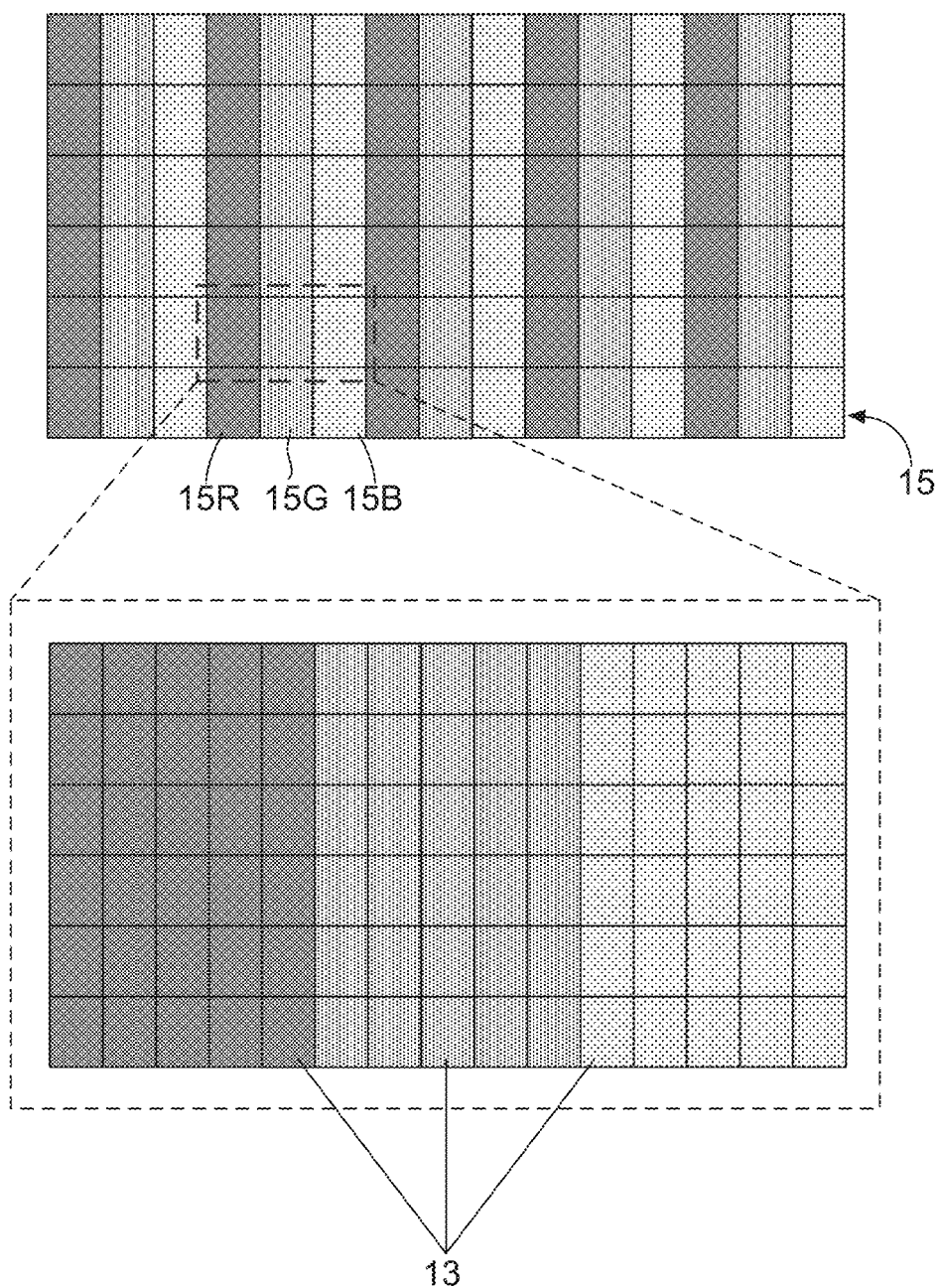
FIG. 5 shows a diagram for depicting the top view of a light conversion layer and a plurality of light emitting elements.
Figure 6:
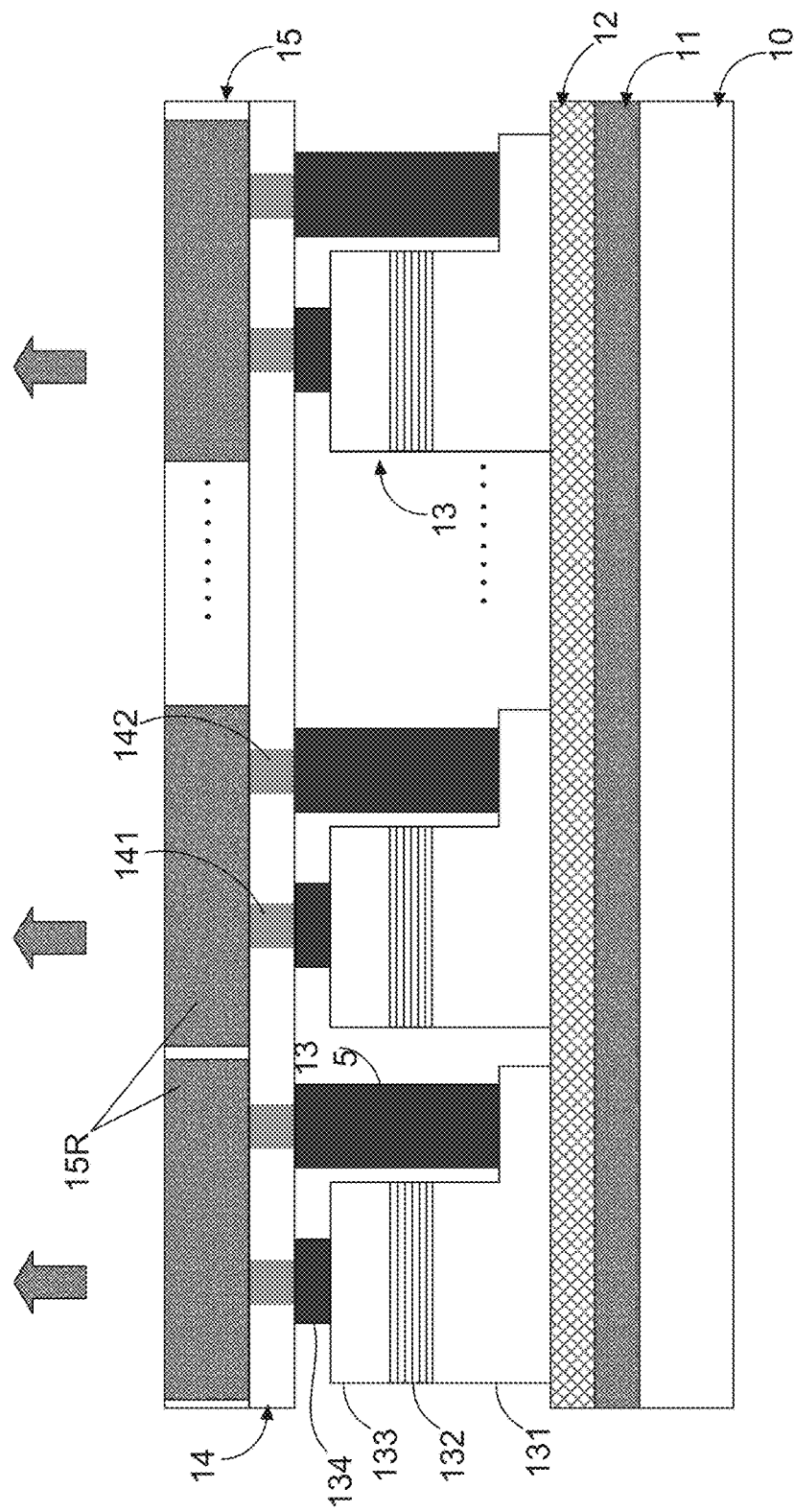
FIG. 6 shows a diagram for depicting the cross-sectional side view of the light conversion layer, the light emitting elements, and a transparent conductive substrate.

In addition, a crystalline material with a lattice constant almost integral multiples of the lattice constant of GaN can also be processed to be the lattice matching layer 12. For instance, Group II-VI compounds such as ZnS and ZnSe have the lattice constant a=0.623 nm and a=0.653 nm, respectively. Please simultaneously refer to FIG. 5 and FIG. 6, wherein FIG. 5 shows a diagram for depicting the top view of the light conversion layer 15 and the plurality of light emitting elements 13, and FIG. 6 provides a diagram for depicting the cross-sectional side view of the light conversion layer 15, the light emitting elements 13, and the transparent conductive substrate 14. The light color of the light-emitting element 13 is dependent on the manufacturing materials of the first semiconductor layer 131, the active layer 132 and the second semiconductor layer 133. It is well known that GaP, GaAsP and AlGaAs are the traditional manufacturing materials of the active layer 13 for making the light-emitting element 13 emit a visible light with a wavelength in a range between 580 nm and 740 nm. However, with the continuous advances of manufacture processing technology of metal-organic chemical vapor deposition (MOCVD), GaN, $Al_xGa_{1-x}N$ and $In_xGa_{1-x}N$ have become the major material for the fabrication of the active layer 13 nowadays. It is worth explaining that, active layer 13 made of GaN is able to emit blue light.

Electronic device engineers skilled in development and manufacture of LED dies (or chips) should know that, light wavelength of the active layer 132 made of $In_xGa_{1-x}N$ can be regulated to be longer by increasing x (<1). On the other hand, increasing x can make light wavelength of the active layer 132 be regulated to be shorter. Herein, it needs to further describe that the active layer 132 made of GaN, $Al_xGa_{1-x}N$ or $In_xGa_{1-x}N$ may form a single multiple quantum well (MQW) structure between the first semiconductor layer 131 and the second semiconductor layer 132. In contrast to the active layer 132, the first semiconductor layer 131 is made of n-type gallium nitride (n-GaN) such as Si-doped GaN), and the second semiconductor layer 133 is made of p-type gallium nitride (p-GaN) like Mg-doped GaN. Moreover, for enhancing electron-hole recombination rate in the active layer 132, the active layer 132 can be made to a multiple quantum well (MQW) structure between the first semiconductor layer 131 and the second semiconductor layer 133, wherein the MQW structure is selected from the group consisting of a multiple stacked structure of GaN and $In_xGa_{1-x}N$, a multiple stacked structure of GaN and $AlGa_{1-x}N$, and a multiple stacked structure of $Al_xGa_{1-x}N$ and $In_xGa_{1-x}N$.

From FIG. 4, FIG. 5 and FIG. 6, it is found that the first electrode 134 is electrically connected to the first semiconductor layer 131, and the second electrode 135 is formed on the second semiconductor layer 133. According to the present invention, the manufacturing material of the first electrode and the second electrode is selected from the group consisting of aluminum (Al), silver (Ag), titanium (Ti), nickel (Ni), gold (Au), copper (Cu), chromium (Cr), platinum (Pt), and combination of aforesaid two or more materials. It is noted that the LED array comprising the plurality of light emitting elements 13 is disposed on the lattice matching layer 12, and the transparent conductive substrate 14 and the light conversion layer 15 are sequentially disposed on the LED array. According to the present invention, the transparent conductive substrate 14 has a plurality of first conductive wires 141 and a plurality of second conductive wires 142, wherein each of the plurality of first conductive wires 141 is connected to one first electrode 134, and each of the plurality of second conductive wires 142 is connected to one second electrodes 135.

The primary technology feature of the present invention is to particularly design the light conversion layer 15 comprising a plurality of red light conversion units 15R, a plurality of green light conversion units 15G and a plurality of blue light conversion units 15B, so as to make each of the plurality of red light conversion units 15R, each of the plurality of green light conversion units 15G and each of the plurality of blue light conversion units 15B all simultaneously shield multi light emitting elements 13 under the isolation provided by the transparent conductive substrate 14. As FIG. 5 and FIG. 6 show, blue light beams radiated from multi light emitting elements 13 are converted to red light beams by one signal red light conversion unit 15R. Moreover, blue light beams radiated from multi light emitting elements 13 are converted to green light beams by one signal green light conversion unit 15G at the same time. Simultaneously, blue light beams radiated from multi light emitting elements 13 are also converted to blue light beams by one signal blue light conversion units 15B. Therefore, it is able to calculate that each of pixels in a Full HD (1920×1080) flexible micro-LED display module 1' of 5.5-inch has an area size of 63 μm×63 μm, wherein each area size comprises one red light conversion unit 15R, one green light conversion unit 15G and one blue light conversion unit 15B. Moreover, the present invention particularly designs that each of three light conversion units (15R, 15G, 15B) shields multi light emitting elements 13 under the isolation provided by the transparent conductive substrate 14.

Figure 7:
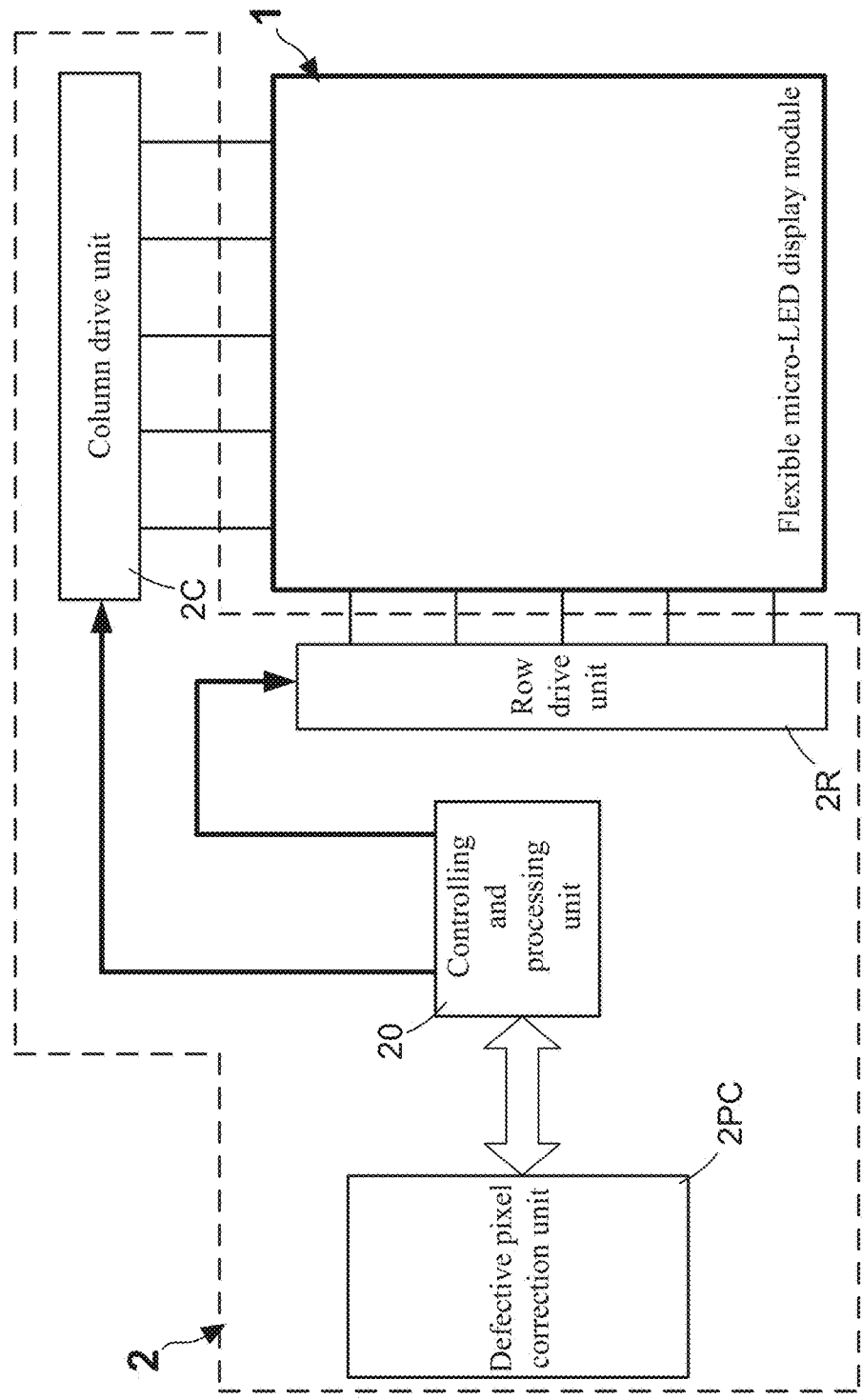
FIG. 7 shows a block diagram of the flexible micro-LED display module and a control circuit thereof.
Figure 8:
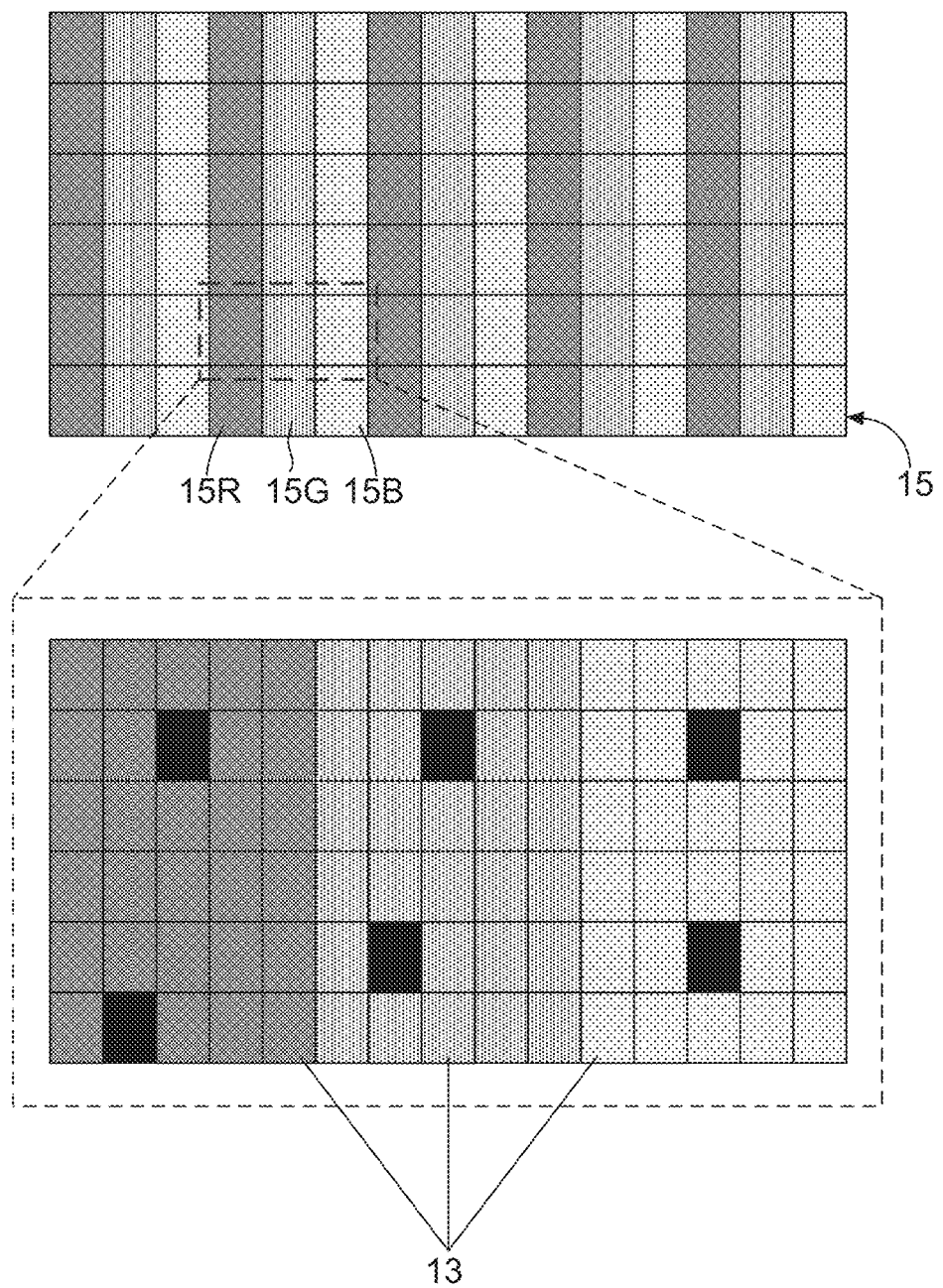
FIG. 8 shows a diagram for depicting the top view of the light conversion layer and the plurality of light emitting elements.

Continuously referring to FIG. 4, FIG. 5 and FIG. 6, and please simultaneously refer to FIG. 7 showing a block diagram of the flexible micro-LED display module and a control circuit thereof. The control circuit 2 is used to control the lighting of the light emitting elements 13 in the flexible micro-LED display module 1, and comprises: a column drive unit 2C, a row drive unit 2R, a controlling and processing unit 20, and a defective pixel correction unit 2PC. FIG. 8 shows a diagram for depicting the top view of the light conversion layer 15 and the plurality of light emitting elements 13. By applying a L-I-V test to the flexible micro-LED display module 1 through the control circuit 2, there are two failure light emitting elements 13 found under one red light conversion unit 15R, and two failure light emitting elements 13 are found to be failure under both one green light conversion unit 15G as well as one blue light conversion unit 15B. In this case, the defective pixel correction unit 2PC is now used to correct luminance and chrominance defects of the flexible micro-LED display module 1 having the failure light emitting elements 13. Briefly speaking, according to the design of the present invention, a single pixel is formed by one red light conversion unit 15R, one green light conversion unit 15G, one blue light conversion unit 15B, and several light-emitting elements 13, wherein the red light conversion unit 15R, the green light conversion unit 15G and the blue light conversion unit 15B all simultaneously shield multi light emitting elements 13 under the isolation provided by the transparent conductive substrate 14. By such particular arrangement, despite the fact that there are one or two light-emitting elements 13 failing to radiate light normally, it is able to apply luminous intensity adjusting process to other light-emitting elements 13 working normally through the use of the defective pixel correction circuit 2PC. As a result, the flexible micro-LED display module 1 can still display video or images with the lowest number of defective pixels capable of meeting the requirements of pixel standards.

Figure 9:
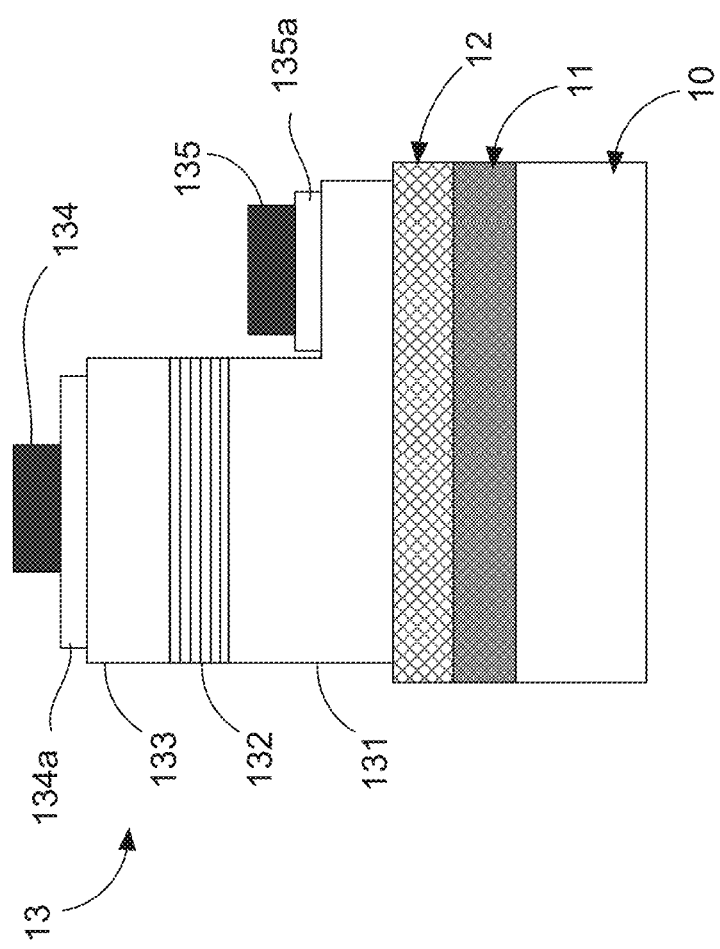
FIG. 9 shows a diagram for depicting the cross-sectional side view of the light emitting element.

In addition, FIG. 9 shows a diagram for depicting the cross-sectional side view of the light emitting element. After comparing FIG. 9 with FIG. 6, it is able to know the light emitting element 13 further comprises a transparent conductive layer 134a, wherein the transparent conductive layer 134a is formed between the first electrode 134 and the first semiconductor layer 131 as well as the second electrode 135 and the second semiconductor layer 133. Moreover, the transparent conductive layer 134a, used for enhancing out coupling efficiency of the flexible micro-LED display module 1 can be made of indium tin oxide (ITO), ZnO, or Ni—Au composite material.

On the other hand, light conversion layer 15 comprises an encapsulation film, and a plurality of light converting particles are enclosed in the encapsulation film for forming the plurality of red light conversion units 15R, the plurality of green light conversion units 15G and the plurality of blue light conversion units 15B. The light converting particles can be phosphor powder or quantum dots, and their exemplary materials are integrated and listed in following Table (4) and Table (5).

TABLE (4)

| Types of phosphor powder | Corresponding exemplary material |
| --- | --- |
| Aluminate phosphor | Eu doped Y-Al-O multi-composition phosphor |
| Silicate phosphor | $Ca_3Si_2O_7:Eu^{2+}$ |
| Phosphate phosphor | $KSr_{1-x}PO_4:Tb_x$ |
| | $K_2SiF_6:Mn^{4+}$ (KSF) |
| Sulfide phosphor | ZnS:X |
| | X = Au, Ag, Cu, Mn, Cd |
| Nitride phosphor | $\beta$-SiAlON:$Eu^{2+}$ |
| Other-type phosphor | $SrGa_2S_4:Eu^{2+}$ (SGS) |

TABLE (5)

| Types of quantum dot (QD) | Corresponding exemplary material |
| --- | --- |
| Group II-VI compounds | CdSe or CdS |
| Group III-V compounds | (Al, In, Ga)P, (Al, In, Ga)As, or (Al, In, Ga)N |
| Group III-V compounds having | CdSe/ZnS core-shell QD core-shell structure |
| Group III-V compounds having | InP/ZnS core-shell QD core-shell structure |
| Group II-VI compounds having non-spherical alloy structure | ZnCdSeS |

Figure 10:
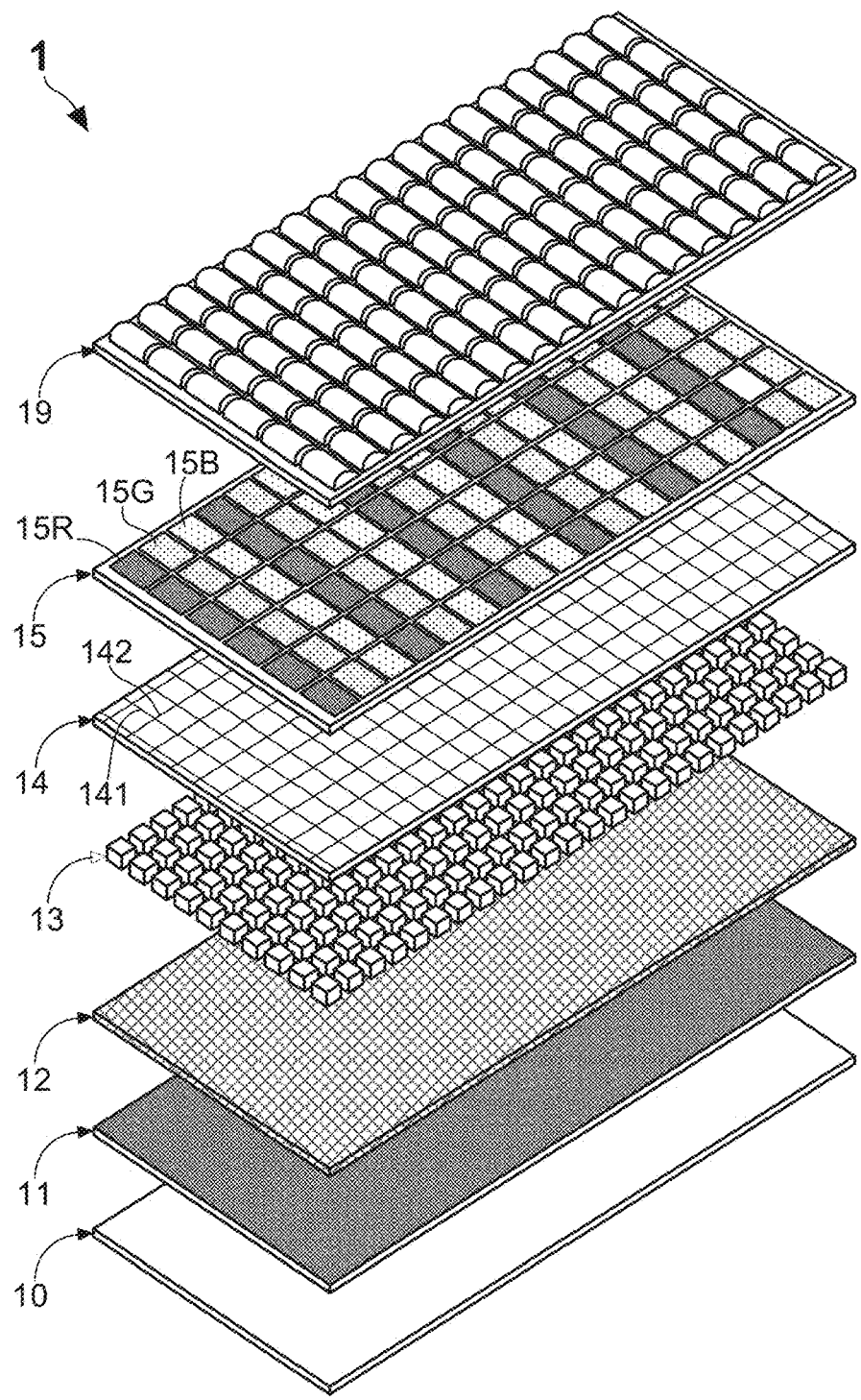
FIG. 10 shows a stereo exploded diagram of a second embodiment of the flexible micro-LED display module.

Besides, FIG. 10 shows a stereo exploded diagram of a second embodiment of the flexible micro-LED display module. After comparing FIG. 10 with FIG. 4, it is able to know the second embodiment of the flexible micro-LED display module 1 comprises a microlens array 19, which is disposed on the light conversion layer 15.

Figure 1:
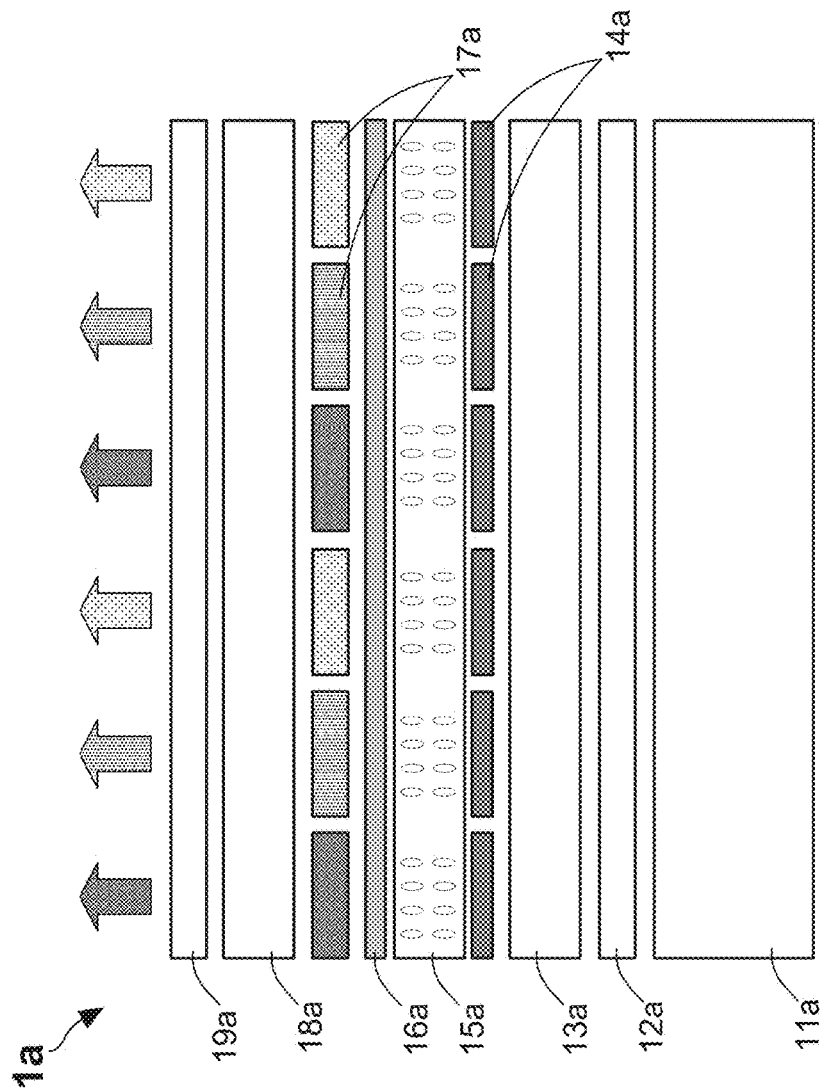
FIG. 1 shows a cross-sectional side view of a TFT-LCD module.
Figure 2:
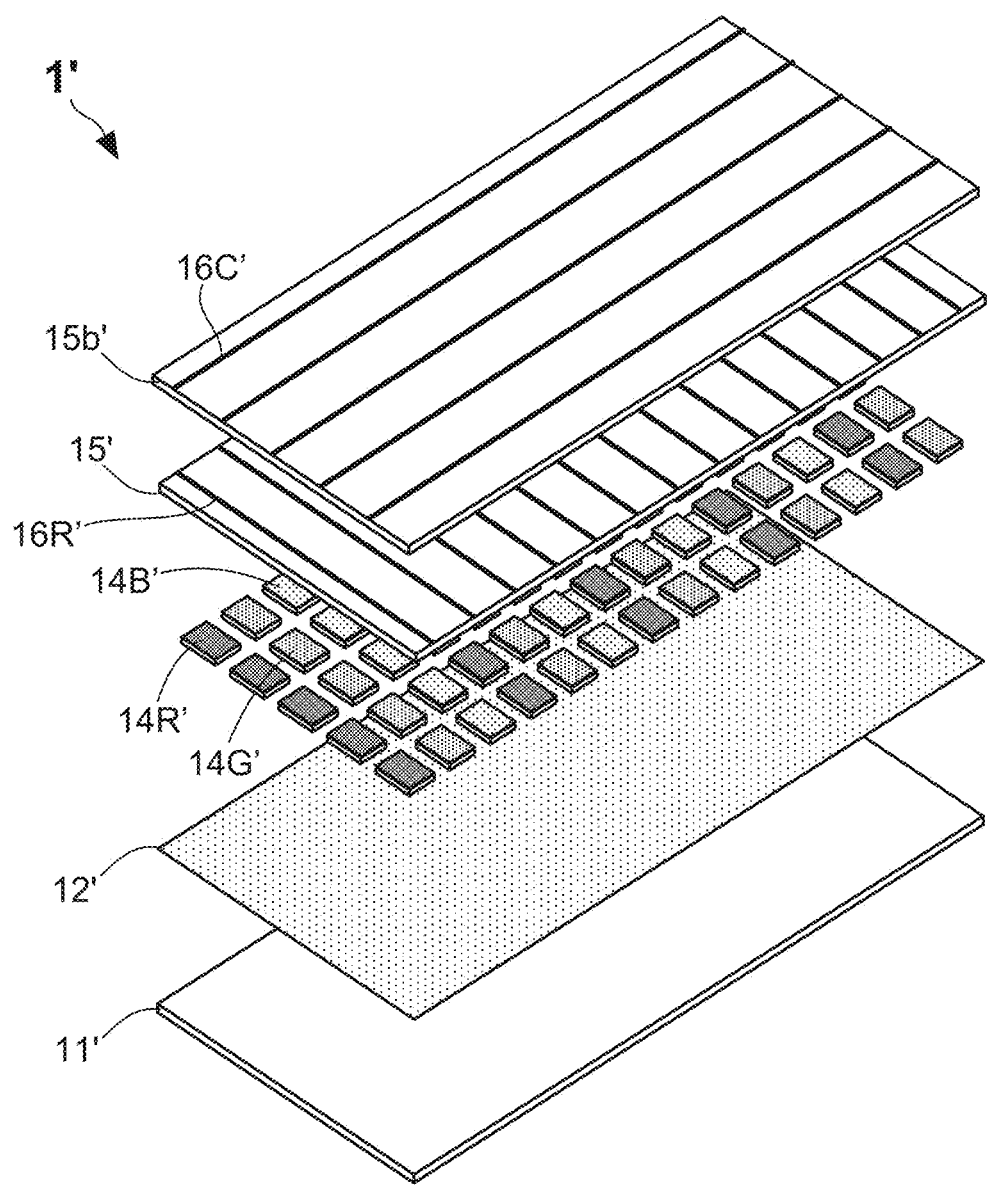
FIG. 2 shows a stereo exploded diagram of an LED display module.
Figure 3:
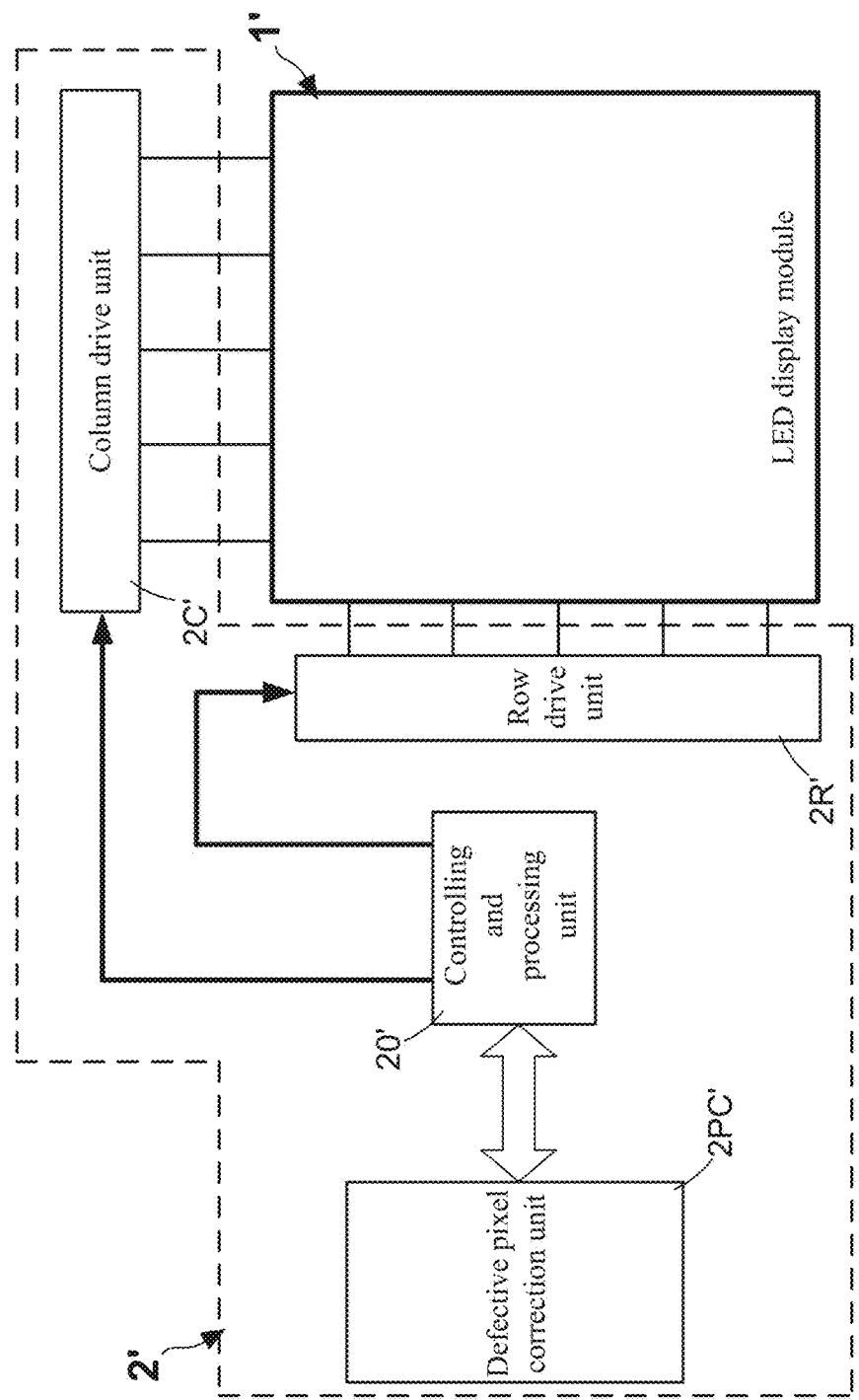
FIG. 3 shows a block diagram of the LED display module and a control circuit thereof.

Therefore, above descriptions have introduced constituting elements and their features of the flexible micro-LED display module 1 disclosed by the present invention completely and clearly; in summary, the present invention includes the advantages of:

(1) Please refer to FIG. 2 and FIG. 3. Because there are many defective pixels resulted from errors of manufacturing process or intrinsic defects of the LED components (14R', 14G', 14B') occurring in LED display module 1', defective pixel correction unit 2PC' is now arranged in the control circuit 2' for correcting luminance and chrominance defects of the LED display module 1'. However, owing to the fact that there are still two or more pixels cannot be corrected or repaired by the defective pixel correction unit 2PC', the LED display module 1' fails to display video or images with the defective pixels capable of meeting the requirements of pixel standards. In view of that, present invention discloses a flexible micro-LED display module 1, comprising: a flexible substrate 10, a substrate protection layer 11, a lattice matching layer 12, an LED array comprising a plurality of light emitting elements 13, a transparent conductive substrate 14, and a light conversion layer 15. According to the present invention, the light conversion layer 15 is constituted by a plurality of red light conversion units 15R, a plurality of green light conversion units 15G, and a plurality of blue light conversion units 15B, and one pixel is formed by one red light conversion unit 15R, one green light conversion unit 15g, one blue light conversion unit 15B, and several light-emitting elements 13. It is noted that, the red light conversion unit 14R, the green light conversion unit 14G and the blue light conversion unit 14B all simultaneously shield multi light emitting elements 13 under the isolation provided by the transparent conductive substrate 14. By such arrangement, in the case of some light-emitting elements 13 failing to radiate light normally, the defective pixel correction circuit 2PC is used to apply luminous intensity adjusting process to other light-emitting elements 13 working normally, so as to make the flexible micro-LED display module 1 able to display video or images with the lowest number of defective pixels capable of meeting the requirements of pixel standards.

The above description is made on embodiments of the present invention. However, the embodiments are not intended to limit scope of the present invention, and all equivalent implementations or alterations within the spirit of the present invention still fall within the scope of the present invention.

What is claimed is:

1. A flexible micro-LED display module, comprising:
   a flexible substrate, being made of a thin metal material;
   a substrate protection layer, being formed on or covering the flexible substrate;
   a lattice matching layer, being formed on the substrate protection layer;
   a light emitting array comprising a plurality of light emitting elements, being formed on the lattice matching layer, and each of the plurality of light emitting elements comprising:
      a first semiconductor layer, being formed on the lattice matching layer;

an active layer, being formed on the first semiconductor layer;

a second semiconductor layer, being formed on the active layer;

a first electrode, being electrically connected to the first semiconductor layer; and a second electrode, being electrically connected to the second semiconductor layer;

a transparent conductive substrate, being disposed on the light emitting array and having a plurality of first conductive wires and a plurality of second conductive wires; wherein each of the plurality of first conductive wires is connected to one first electrode, and each of the plurality of second conductive wires being connected to one second electrodes; and a light conversion layer, being disposed on the transparent conductive substrate and comprising a plurality of red light conversion units, a plurality of green light conversion units and a plurality of blue light conversion units; wherein each of the plurality of red light conversion units, each of the plurality of green light conversion units and each of the plurality of blue light conversion units all simultaneously shield multi light emitting elements under an isolation provided by the transparent conductive substrate.

2. The flexible micro-LED display module of claim 1, wherein the thin meal material is selected from the group consisting of stainless steel, copper (Cu), gold (Au), nickel (Ni), molybdenum (Mo), titanium (Ti), tungsten (W), and combination of aforesaid two or more materials.

3. The flexible micro-LED display module of claim 1, wherein a manufacturing material of the lattice matching layer being selected from the group consisting of AlN, undoped-GaN, and ZnO.

4. The flexible micro-LED display module of claim 1, wherein a manufacturing material of the substrate protection layer is selected from the group consisting of $SiO_2$, $TiO_2$, NiO, $Al_2O_3$, ZnO, nitride, halide, Si-based compound, and combination of aforesaid two or more materials.

5. The flexible micro-LED display module of claim 1, wherein the first semiconductor layer is made of n-type gallium nitride (n-GaN), and the second semiconductor layer being made of p-type gallium nitride (p-GaN.

6. The flexible micro-LED display module of claim 1, wherein the active layer forms a single multiple quantum well (MQW) structure between the first semiconductor layer and the second semiconductor layer, and the active layer being made of GaN, $Al_xGa_{1-x}N$ or $In_xGa_{1-x}N$.

7. The flexible micro-LED display module of claim 1, wherein the active layer forms a multiple quantum well (MQW) structure between the first semiconductor layer and the second semiconductor layer, and the MQW structure be selected from the group consisting of a multiple stacked structure of GaN and $In_xGa_{1-x}N$, a multiple stacked structure of GaN and $Al_xGa_{1-x}N$, and a multiple stacked structure of $Al_xGa_{1-x}N$ and $In_xGa_{1-x}N$.

8. The flexible micro-LED display module of claim 1, wherein a manufacturing material of the first electrode and the second electrode is selected from the group consisting of aluminum (Al), silver (Ag), titanium (Ti), nickel (Ni), gold (Au), copper (Cu), chromium (Cr), platinum (Pt), and combination of aforesaid two or more materials.

9. The flexible micro-LED display module of claim 1, wherein the thickness of the flexible substrate is in a range from 20 μm to 500 μm, and the thickness of the substrate protection layer being in a range between 50 nm and 1000 nm.

10. The flexible micro-LED display module of claim 1, further comprising:

a transparent conductive layer, being formed between the first electrode and the first semiconductor layer as well as the second electrode and the second semiconductor layer.

11. The flexible micro-LED display module of claim 1, wherein the light conversion layer comprises an encapsulation film, and a plurality of light converting particles being enclosed in the encapsulation film for forming the plurality of red light conversion units, the plurality of green light conversion units and the plurality of blue light conversion units.

12. The flexible micro-LED display module of claim 11, wherein a manufacturing material of the plurality of light converting particles is selected from the group consisting of aluminate phosphor, silicate phosphor, phosphate phosphor, sulfide phosphor, and nitride phosphor.

13. The flexible micro-LED display module of claim 11, wherein the plurality of light converting particles are quantum dots, and a manufacturing material of the quantum dots is selected from the group consisting of Group II-VI compounds, Group III-V compounds, Group II-VI compounds having core-shell structure, Group III-V compounds having core-shell structure, Group II-VI compounds having non-spherical alloy structure, and combination of the aforesaid two or above compounds.

14. The flexible micro-LED display module of claim 1, further comprising:

a microlens array, being disposed on the light conversion layer.

* * * * *